(12) United States Patent
Takeda et al.

(10) Patent No.: US 7,618,763 B2
(45) Date of Patent: Nov. 17, 2009

(54) RESIST COMPOSITION AND PATTERNING PROCESS

(75) Inventors: Takanobu Takeda, Joetsu (JP); Osamu Watanabe, Joetsu (JP); Daisuke Manba, Joetsu (JP); Tsugio Kaneda, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 130 days.

(21) Appl. No.: 11/556,830

(22) Filed: Nov. 6, 2006

(65) Prior Publication Data

US 2007/0105042 A1 May 10, 2007

(30) Foreign Application Priority Data

Nov. 8, 2005 (JP) .............................. 2005-323523

(51) Int. Cl.
G03F 7/039 (2006.01)
G03F 7/038 (2006.01)
G03F 7/20 (2006.01)
G03F 7/30 (2006.01)

(52) U.S. Cl. ................... 430/270.1; 430/905; 430/907; 430/326; 430/330

(58) Field of Classification Search ........................ None
See application file for complete search history.

(56) References Cited

U.S. PATENT DOCUMENTS

| 4,491,628 | A | 1/1985 | Ito et al. |
| 4,603,101 | A | 7/1986 | Crivello |
| 5,252,435 | A | 10/1993 | Tani et al. |
| 5,310,619 | A | 5/1994 | Crivello et al. |
| 5,324,804 | A | 6/1994 | Steinmann |
| 5,350,660 | A | 9/1994 | Unaro et al. |
| 6,746,817 | B2 | 6/2004 | Takeda et al. |
| 2004/0023151 | A1 | 2/2004 | Takeda et al. |
| 2004/0033432 | A1 | 2/2004 | Ohsawa et al. |
| 2004/0167322 | A1 | 8/2004 | Ohsawa et al. |

FOREIGN PATENT DOCUMENTS

| EP | 1 204 001 A1 | 5/2002 |
| JP | 62-115440 A | 5/1987 |
| JP | 63-27829 A | 2/1988 |
| JP | 2-27660 B2 | 6/1990 |
| JP | 3-223858 A | 10/1991 |
| JP | 3-275149 A | 12/1991 |
| JP | 4-211258 A | 8/1992 |
| JP | 6-100488 A | 4/1994 |
| JP | 6-289608 A | 10/1994 |
| JP | 2002-20610 A | 7/2002 |
| JP | 2004-348014 A | 12/2004 |

OTHER PUBLICATIONS

Machine-assisted English translation of JP2004-348014 (Takeda et al), provided by JPO.*
Extended European search report dated May 3, 2007 of European Application No. 06255573.5.

* cited by examiner

*Primary Examiner*—Sin J. Lee
(74) *Attorney, Agent, or Firm*—Westerman, Hattori, Daniels & Adrian, LLP

(57) ABSTRACT

A hydroxystyrene/indene/alkoxyisobutoxystyrene copolymer having Mw of 1,000-500,000 is formulated as a base resin to give a resist composition, typically chemically amplified positive resist composition. The composition exhibits a high resolution, a satisfactory resist pattern profile after development, and improved etch resistance and is thus suitable as a micropatterning material for the fabrication of VLSI.

3 Claims, No Drawings

RESIST COMPOSITION AND PATTERNING PROCESS

CROSS-REFERENCE TO RELATED APPLICATION

This non-provisional application claims priority under 35 U.S.C. §119(a) on Patent Application No. 2005-323523 filed in Japan on Nov. 8, 2005, the entire contents of which are hereby incorporated by reference.

TECHNICAL FIELD

This invention relates to a resist composition, typically chemically amplified positive resist composition, comprising as the base resin a polymer containing alkoxyisobutoxystyrene as reactive groups which are decomposable under the action of an acid to increase solubility in alkali and also having indene units copolymerized, the composition having a high resolution, a satisfactory resist pattern profile after development, and improved etch resistance, and being suitable for the fabrication of VLSI; and a patterning process using the resist composition.

BACKGROUND OF THE INVENTION

While a number of recent efforts are being made to achieve a finer pattern rule in the drive for higher integration and operating speeds in LSI devices, deep-ultraviolet lithography is thought to hold particular promise as the next generation in microfabrication technology. Deep-UV lithography is capable of achieving a feature size of 0.5 µm or less and, when a resist having low light absorption is used, can form patterns with sidewalls that are nearly perpendicular to the substrate.

Recently developed acid-catalyzed chemical amplification positive resists, such as those described in JP-B 2-27660, JP-A 63-27829, U.S. Pat. No. 4,491,628 and U.S. Pat. No. 5,310,619, utilize a high-intensity KrF excimer laser as the deep-UV light source. These resists, with their excellent properties such as high sensitivity, high resolution, and good dry etching resistance, are especially promising for deep-UV lithography.

Such chemically amplified positive resists include two-component systems comprising a base resin and a photoacid generator, and three-component systems comprising a base resin, a photoacid generator, and a dissolution inhibitor having acid labile groups.

For example, JP-A 62-115440 describes a resist material comprising poly-p-tert-butoxystyrene and a photoacid generator. JP-A 3-223858 describes a similar two-component resist material comprising a resin bearing tert-butoxy groups within the molecule, in combination with a photoacid generator. JP-A 4-211258 describes a two-component resist material which is comprised of polyhydroxystyrene bearing methyl, isopropyl, tert-butyl, tetrahydropyranyl, or trimethylsilyl groups, together with a photoacid generator.

JP-A 6-100488 discloses a resist material comprised of a polydihydroxystyrene derivative; such as poly[3,4-bis(2-tetrahydropyranyloxy)styrene], poly[3,4-bis(tert-butoxycarbonyloxy)styrene] or poly[3,5-bis(2-tetrahydropyranyloxy)styrene], and a photoacid generator.

The base resins in these resist materials have an optimum baking temperature as high as about 130° C. when the acid labile group is tert-butyl, and low resolution when the acid labile group is tert-butoxycarbonyl. In either case, the resist pattern tends to take on a T-top profile. By contrast, when the acid labile groups are alkoxyalkyl groups such as ethoxyethyl and 2-tetrahydropyranyl which are cleaved by weak acids, the corresponding resins have the drawback that the pattern configuration is considerably narrowed with the passage of time between exposure and heat treatment. This makes it difficult to form a resist film to a reduced thickness compliant with a reduced feature size. Also some resins have poor heat resistance so that lenses in the stepper can be contaminated by outgassing from within the resist during development. Because of these problems, none of the foregoing resins are compliant with micro-patterning.

To provide higher transparency and firm adhesion to substrates and to improve footing on substrates and etching resistance, JP-A 3-275149 and JP-A 6-289608 propose resist materials using copolymers of hydroxystyrene with a (meth)acrylic acid tertiary ester. The resist materials of this type are not satisfactory because of poor heat resistance and an indefinite pattern profile after exposure.

Also developed was a resist composition comprising an indene-(meth)acrylic acid tertiary ester copolymer as described in JP-A 2002-202610. Since the copolymer has acid labile groups of the acetal type as is often the case in the prior art, a problem can occur that a pattern profile degrades as a result of the pattern film becoming thinner.

With the current trend toward higher resolution, thinning of pattern film is in simultaneous progress. Accordingly, there is a desire to have a resist material having a definite resist pattern profile after development and higher etching resistance.

SUMMARY OF THE INVENTION

An object of the invention is to provide a resist composition, especially chemically amplified positive resist composition, which has a superior resolution to prior art positive resist compositions as well as a satisfactory pattern profile after exposure and high etching resistance.

Another object of the invention is to provide a patterning process using the resist composition.

It has been found that a polymer comprising recurring units of the general formula (1), (2), (3), (4) or (5), shown below, and having a weight average molecular weight of 1,000 to 500,000 is an effective base resin in a positive resist composition, especially chemically amplified positive resist composition. The chemically amplified positive resist composition containing a photoacid generator and an organic solvent as well as the polymer can form a resist film having many advantages including an increased dissolution contrast, high resolution, and a good pattern profile after exposure, and has an ability to form a resist film of reduced thickness compliant with a reduced feature size. The composition is thus suited for practical use and advantageously used in precise microfabrication, especially in VLSI manufacture.

Accordingly, the present invention provides resist compositions and a patterning process as defined below.

A first embodiment is a resist composition comprising a polymer comprising recurring units of the following general formula (1) and having a weight average molecular weight of 1,000 to 500,000.

(1)

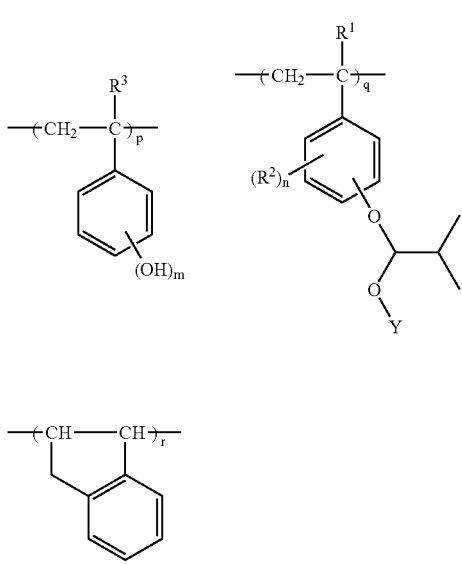

Herein $R^1$ and $R^3$ are each independently a hydrogen atom, hydroxy group, straight or branched alkyl group, halogen atom or trifluoromethyl group, $R^2$ is a hydrogen atom, hydroxy group, halogen atom or trifluoromethyl group, Y is a straight, branched or cyclic alkyl group of 1 to 12 carbon atoms, n is 0 or a positive integer of 1 to 4, m is 0 or a positive integer of 1 to 5, and p, q and r are positive numbers.

A second embodiment is a resist composition comprising a polymer comprising recurring units of the following general formula (2) and having a weight average molecular weight of 1,000 to 500,000.

(2)

Herein $R^1$, $R^2$, $R^3$, m, n, p, q and r are as defined above.

A third embodiment is a resist composition comprising a polymer comprising recurring units of the following general formula (3) and having a weight average molecular weight of 1,000 to 500,000.

(3)

Herein $R^1$, $R^2$, $R^3$, m, n, p, q and r are as defined above, and a is 0 or a positive integer of 1 to 4.

A fourth embodiment is a resist composition comprising a polymer comprising recurring units of the following general formula (4) and having a weight average molecular weight of 1,000 to 500,000.

(4)

Herein $R^1$, $R^2$, $R^3$, m, n, p, q and r are as defined above.

A fifth embodiment is a resist composition comprising a polymer comprising recurring units of the following general formula (5) and having a weight average molecular weight of 1,000 to 500,000.

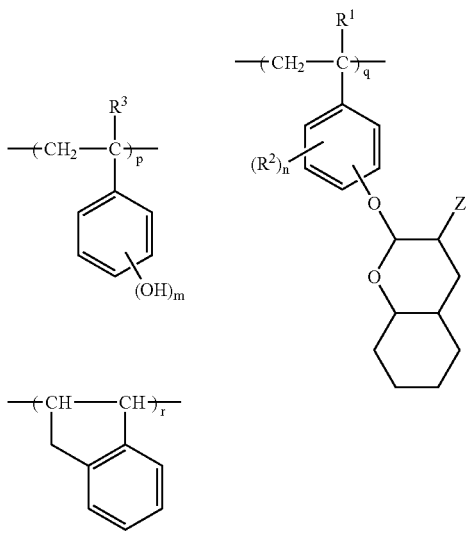

(5)

Herein $R^1$, $R^2$, $R^3$, m, n, p, q and r are as defined above, and Z is a hydrogen atom or straight, branched or cyclic alkyl group of 1 to 10 carbon atoms.

In another aspect, the invention provides a chemically amplified positive resist composition comprising (A) an organic solvent,
(B) the polymer defined above as a base resin, and
(C) a photoacid generator.

Optionally, the composition further comprises (D) a dissolution inhibitor and/or (E) a basic compound.

In a further aspect, the invention provides a process for forming a resist pattern comprising the steps of applying the resist composition onto a substrate to form a coating; heat treating the coating and then exposing it to high-energy radiation, EUV or electron beam through a photomask; and optionally heat treating the exposed coating and developing it with a liquid developer.

BENEFITS OF THE INVENTION

The present invention uses a polymer containing alkoxyisobutoxystyrene as reactive groups which are decomposable under the action of an acid to increase solubility in alkali and also having indene units copolymerized, and formulates it as a base resin to give a resist composition, typically chemically amplified positive resist composition. The composition exhibits a high resolution, a satisfactory resist pattern profile after development, and improved etch resistance and is thus suitable as a micropatterning material for the fabrication of VLSI.

DESCRIPTION OF THE PREFERRED EMBODIMENT

The resist composition of the invention comprises a polymer or high molecular weight compound comprising recurring units of any one of the general formulae (1) to (5), shown below, and having a weight average molecular weight of 1,000 to 500,000.

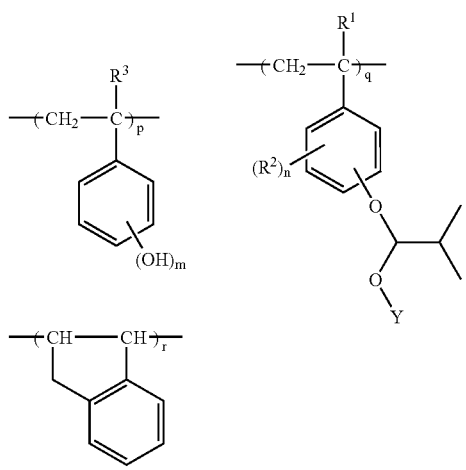

(1)

Herein $R^1$ and $R^3$ are each independently a hydrogen atom, hydroxy group, straight or branched alkyl group, halogen atom or trifluoromethyl group, $R^2$ is a hydrogen atom, hydroxy group, halogen atom or trifluoromethyl group, Y is a straight, branched or cyclic alkyl group of 1 to 12 carbon atoms, n is 0 or a positive integer of 1 to 4, m is 0 or a positive integer of 1 to 5, and p, q and r are positive numbers.

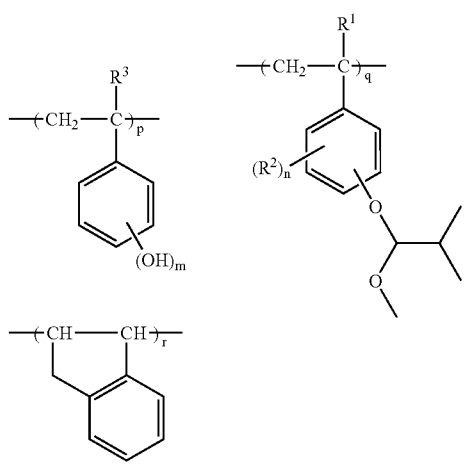

(2)

Herein $R^1$, $R^2$, $R^3$, m, n, p, q and r are as defined above.

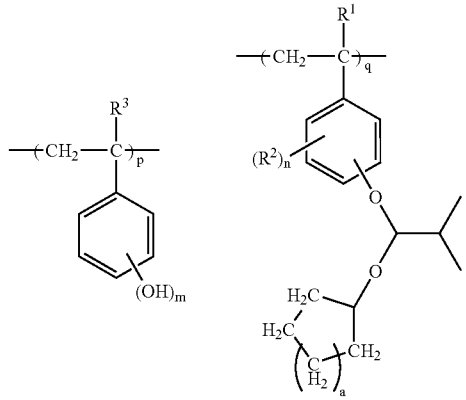

(3)

-continued

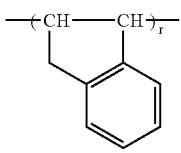

Herein $R^1$, $R^2$, $R^3$, m, n, p, q and r are as defined above, and a is 0 or a positive integer of 1 to 4.

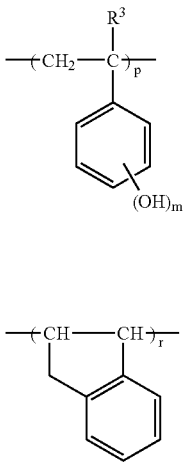
(4)

Herein $R^1$, $R^2$, $R^3$, m, n, p, q and r are as defined above.

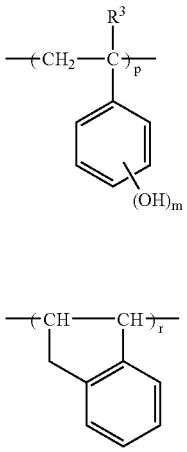
(5)

Herein $R^1$, $R^2$, $R^3$, m, n, p, q and r are as defined above, and Z is a hydrogen atom or straight, branched or cyclic alkyl group of 1 to 10 carbon atoms.

The straight or branched alkyl groups represented by $R^1$ and $R^3$ are preferably those of 1 to 6 carbon atoms, and include, for example, methyl, ethyl, propyl, isopropyl, n-butyl, isobutyl and tert-butyl.

When $R^1$, $R^2$, and $R^3$ stand for halogen atoms, exemplary are fluorine, chlorine and bromine atoms.

In formula (1), Y is an alkyl group of 1 to 12 carbon atoms, preferably 1 to 10 carbon atoms. Inter alia, methyl, ethyl, propyl, isopropyl, cyclohexyl, and cyclopentyl groups are preferred from the pattern profile standpoint, although a choice may be made of other alkyl groups when other performance factors are to be considered together. For Z in formula (5), those groups exemplified for Y are also useful.

In addition to the units suffixed with p, q and r, the polymer may further contain units (suffixed with s) derived from (meth)acrylic acid tertiary ester and alkoxystyrene monomers, for example. With respect to the proportion of p, q, r and s, they should preferably satisfy the following condition:
$0 < p/(p+q+r+s) \leq 0.8$,
more preferably $0.3 \leq p/(p+q+r+s) \leq 0.8$,
$0 < q/(p+q+r+s) \leq 0.5$,
more preferably $0.1 \leq q/(p+q+r+s) \leq 0.35$,
$0 < r/(p+q+r+s) \leq 0.35$,
more preferably $0.05 \leq r/(p+q+r+s) \leq 0.15$, and
$0 \leq s/(p+q+r+s) \leq 0.2$.

If q=0, that is, if the polymer of formula (1) does not contain the q-suffixed units, a contrast in alkali dissolution rate is lost and the resolution becomes poor. Too high a proportion of p may lead to too high an alkali dissolution rate in unexposed areas. Etching resistance improves with an increasing proportion of r, but too high a proportion of r may lead to a reduced resolution. Suitable selection of the numbers p, q, r and s within the above ranges makes it possible to control the resolution, etching resistance, and pattern profile as desired.

The inventive polymers should have a weight average molecular weight (Mw) of about 1,000 to 500,000 and preferably about 2,000 to 30,000, as measured by gel permeation chromatography (GPC) versus polystyrene standards. With too low Mw, polymers become less resistant to heat. Polymers with too high Mw have low alkali solubility and tend to induce a footing phenomenon after pattern formation.

It is recommended that the multi-component copolymer of formula (1), (2), (3), (4) or (5) have a controlled molecular weight dispersity (Mw/Mn). If a copolymer has a wide dispersity, it contains more polymer fractions of low molecular weight and high molecular weight and thus forms a pattern after exposure with foreign matter left thereon or its shape collapsed. The influence of a molecular weight and its dispersity becomes greater as the pattern rule becomes finer. In order that a resist composition be advantageously used in patterning features to a finer size, the multi-component copolymer should preferably be a narrow disperse one having a molecular weight dispersity of 1.0 to 2.0, especially 1.0 to 1.5.

It is now described how to prepare the inventive polymers. In one method, a polymer can be synthesized by dissolving acetoxystyrene and indene monomers in an organic solvent, adding a radical initiator, effecting heat polymerization, and subjecting the resulting polymer in the organic solvent to alkaline hydrolysis for deprotecting acetoxy groups, thereby forming a binary copolymer of hydroxystyrene and indene. Examples of the organic solvent which can be used during the polymerization include toluene, benzene, tetrahydrofuran, diethyl ether, dioxane, and the like. Suitable polymerization initiators include 2,2'-azobisisobutyronitrile, 2,2'-azobis (2,4-dimethylvaleronitrile) dimethyl 2,2-azobis(2-methylpropionate), benzoyl peroxide, lauroyl peroxide, and the like.

Polymerization is preferably effected by heating at 50 to 80° C. The reaction time is usually about 2 to 100 hours, preferably about 5 to 20 hours. The bases used for alkaline hydrolysis include aqueous ammonia and triethylamine. For the hydrolysis, the reaction temperature is usually −20° C. to 100° C., preferably 0° C. to 60° C., and the reaction time is usually about 0.2 to 100 hours, preferably about 0.5 to 20 hours.

Next, the binary copolymer of hydroxystyrene and indene obtained above is dissolved in an organic solvent, to which a compound having the general formula (6):

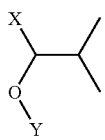

(6)

wherein X is a chlorine, bromine or iodine atom, and Y is a straight, branched or cyclic alkyl group of 1 to 12 carbon atoms is added dropwise under basic conditions, and reaction is allowed to take place. Subsequent washing, crystallization and drying yields the target polymer.

Besides the method described above, polymers can also be synthesized by dissolving a hydroxystyrene-indene copolymer in an organic solvent, and adding an alkyl butenyl ether thereto in the presence of an acid catalyst; or by copolymerizing acetoxystyrene, alkoxyisobutyloxystyrene and indene monomers to form a copolymer and subjecting acetoxy groups on the copolymer to deprotection reaction under basic conditions. It is noted that the synthesis procedure is not limited to the aforementioned.

Resist Composition

The resist composition of the invention uses the above-mentioned polymer as a base resin and is typically positive working and especially useful as a chemically amplified positive resist composition. Specifically the chemically amplified positive resist composition comprises (A) an organic solvent, (B) a polymer comprising recurring units of any one of the general formulae (1) to (5) as a base resin, and (C) a photoacid generator. If desired, the resist composition further includes (D) a dissolution inhibitor and/or (E) a basic compound.

Organic Solvent A

In the chemically amplified positive resist composition of the invention, component (A) is an organic solvent. Illustrative, non-limiting, examples of the solvent include butyl acetate, amyl acetate, cyclohexyl acetate, 3-methoxybutyl acetate, methyl ethyl ketone, methyl amyl ketone, cyclohexanone, cyclopentanone, 3-ethoxyethyl propionate, 3-ethoxymethyl propionate, 3-methoxymethyl propionate, methyl acetoacetate, ethyl acetoacetate, diacetone alcohol, methyl pyruvate, ethyl pyruvate, propylene glycol monomethyl ether, propylene glycol monoethyl ether, propylene glycol monomethyl ether propionate, propylene glycol monoethyl ether propionate, ethylene glycol monomethyl ether, ethylene glycol monoethyl ether, diethylene glycol monomethyl ether, diethylene glycol monoethyl ether, 3-methyl-3-methoxybutanol, N-methylpyrrolidone, dimethylsulfoxide, γ-butyrolactone, propylene glycol methyl ether acetate, propylene glycol ethyl ether acetate, propylene glycol propyl ether acetate, methyl lactate, ethyl lactate, propyl lactate, and tetramethylene sulfone. Of these, the propylene glycol alkyl ether acetates and alkyl lactates are especially preferred. The solvents may be used alone or in admixture of two or more. An exemplary useful solvent mixture is a mixture of a propylene glycol alkyl ether acetate and an alkyl lactate. It is noted that the alkyl groups of the propylene glycol alkyl ether acetates are preferably those of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. It is also noted that the alkyl groups of the alkyl lactates are preferably those of 1 to 4 carbon atoms, for example, methyl, ethyl and propyl, with methyl and ethyl being especially preferred.

When the propylene glycol alkyl ether acetate is used as the solvent, it preferably accounts for at least 50% by weight of the entire solvent. Also when the alkyl lactate is used as the solvent, it preferably accounts for at least 50% by weight of the entire solvent. When a mixture of propylene glycol alkyl ether acetate and alkyl lactate is used as the solvent, that mixture preferably accounts for at least 50% by weight of the entire solvent. In this solvent mixture, it is further preferred that the propylene glycol alkyl ether acetate is 60 to 95% by weight and the alkyl lactate is 40 to 5% by weight. A lower proportion of the propylene glycol alkyl ether acetate would invite a problem of inefficient coating whereas a higher proportion thereof would provide insufficient dissolution and allow for particle and foreign matter formation. A lower proportion of the alkyl lactate would provide insufficient dissolution and cause the problem of many particles and foreign matter whereas a higher proportion thereof would lead to a composition which has a too high viscosity to apply and loses storage stability.

Usually the solvent is used in amounts of about 300 to 2,000 parts, preferably about 400 to 1,000 parts by weight per 100 parts by weight of the base resin in the chemically amplified positive resist composition. The concentration is not limited to this range as long as film formation by existing methods is possible.

Photoacid Generator C

The photoacid generator (C) is a compound capable of generating an acid upon exposure to high energy radiation. Preferred photoacid generators are sulfonium salts, iodonium salts, sulfonyldiazomethanes, and N-sulfonyloxyimides. These photoacid generators are illustrated below while they may be used alone or in admixture of two or more.

Sulfonium salts are salts of sulfonium cations with sulfonates. Exemplary sulfonium cations include triphenylsulfonium, (4-tert-butoxyphenyl)diphenylsulfonium, bis(4-tert-butoxyphenyl)phenylsulfonium, tris(4-tert-butoxyphenyl)sulfonium, (3-tert-butoxyphenyl)diphenylsulfonium, bis(3-tert-butoxyphenyl)phenylsulfonium, tris(3-tert-butoxyphenyl)sulfonium, (3,4-di-tert-butoxyphenyl)diphenylsulfonium, bis(3,4-di-tert-butoxyphenyl)phenylsulfonium, tris(3,4-di-tert-butoxyphenyl)sulfonium, diphenyl(4-thiophenoxyphenyl)sulfonium, (4-tert-butoxycarbonylmethyloxyphenyl)diphenylsulfonium, tris(4-tert-butoxycarbonylmethyloxyphenyl)sulfonium, (4-tert-butoxyphenyl)bis(4-dimethylaminophenyl)sulfonium, tris(4-dimethylaminophenyl)sulfonium, 2-naphthyldiphenylsulfonium, dimethyl-2-naphthylsulfonium, 4-hydroxyphenyldimethylsulfonium, 4-methoxyphenyldimethylsulfonium, trimethylsulfonium, 2-oxocyclohexylcyclohexylmethylsulfonium, trinaphthylsulfonium, and tribenzylsulfonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Sulfonium salts based on combination of the foregoing examples are included.

Iodinium salts are salts of iodonium cations with sulfonates. Exemplary iodinium cations are aryliodonium cations including diphenyliodinium, bis(4-tert-butylphenyl)iodonium, 4-tert-butoxyphenylphenyliodonium, and 4-methoxyphenylphenyliodonium. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, 4-(4-toluenesulfonyloxy)benzenesulfonate, naphthalenesulfonate, camphorsulfonate, octanesulfonate, dodecylbenzenesulfonate, butanesulfonate, and methanesulfonate. Iodonium salts based on combination of the foregoing examples are included.

Exemplary sulfonyldiazomethane compounds include bis-sulfonyldiazomethane compounds and sulfonyl-carbonyldiazomethane compounds such as bis(ethylsulfonyl)diazomethane, bis(1-methylpropylsulfonyl)diazomethane, bis(2-methylpropylsulfonyl)diazomethane, bis(1,1-dimethylethylsulfonyl)diazomethane, bis(cyclohexylsulfonyl)diazomethane, bis(perfluoroisopropylsulfonyl)diazomethane, bis(phenylsulfonyl)diazomethane, bis(4-methylphenylsulfonyl)diazomethane, bis(2,4-dimethylphenylsulfonyl)diazomethane, bis(2-naphthylsulfonyl)diazomethane, 4-methylphenylsulfonylbenzoyldiazomethane, tert-butylcarbonyl-4-methylphenylsulfonyldiazomethane, 2-naphthylsulfonylbenzoyldiazomethane, 4-methylphenylsulfonyl-2-naphthoyldiazomethane, methylsulfonylbenzoyldiazomethane, and tert-butoxycarbonyl-4-methylphenylsulfonyldiazomethane.

N-sulfonyloxyimide photoacid generators include combinations of imide skeletons with sulfonates. Exemplary imide skeletons are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide. Exemplary sulfonates include trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Benzoinsulfonate photoacid generators include benzoin tosylate, benzoin mesylate, and benzoin butanesulfonate.

Pyrogallol trisulfonate photoacid generators include pyrogallol, phloroglycine, catechol, resorcinol, and hydroquinone, in which all the hydroxyl groups are replaced by trifluoromethanesulfonate, nonafluorobutanesulfonate, heptadecafluorooctanesulfonate, 2,2,2-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate.

Nitrobenzyl sulfonate photoacid generators include 2,4-dinitrobenzyl sulfonate, 2-nitrobenzyl sulfonate, and 2,6-dinitrobenzyl sulfonate, with exemplary sulfonates including trifluoromethanesulfonate, nonafluorobutanesulfonate, heptadecafluorooctanesulfonate, 2.2,22-trifluoroethanesulfonate, pentafluorobenzenesulfonate, 4-trifluoromethylbenzenesulfonate, 4-fluorobenzenesulfonate, toluenesulfonate, benzenesulfonate, naphthalenesulfonate, camphorsulfonate, octanesulfonate, dodecylbenzenesulfonate, butanesulfonate, and methanesulfonate. Also useful are analogous nitrobenzyl sulfonate compounds in which the nitro group on the benzyl side is replaced by a trifluoromethyl group.

Sulfone photoacid generators include bis(phenylsulfonyl)methane, bis(4-methylphenylsulfonyl)methane, bis(2-naphthylsulfonyl)methane, 2,2-bis(phenylsulfonyl)propane, 2,2-bis(4-methylphenylsulfonyl)propane, 2,2-bis(2-naphthylsulfonyl)propane, 2-methyl-2-(p-toluenesulfonyl)propiophenone, 2-cyclohexylcarbonyl-2-(p-toluenesulfonyl)propane, and 2,4-dimethyl-2-(p-toluenesulfonyl)pentan-3-one.

Photoacid generators in the form of glyoxime derivatives include bis-O-(p-toluenesulfonyl)-α-dimethylglyoxime, bis-O-(p-toluenesulfonyl)-α-diphenylglyoxime, bis-o-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-o-(n-butanesulfonyl)-α-dimethylglyoxime, bis-o-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexylsulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Of these photoacid generators, the sulfonium salts, bissulfonyldiazomethane compounds, and N-sulfonyloxyimide compounds are preferred.

While the anion of the optimum acid to be generated differs depending on the ease of scission of acid labile groups introduced in the polymer, an anion which is non-volatile and not extremely diffusive is generally chosen. The preferred anions include benzenesulfonic acid anions, toluenesulfonic acid anions, 4-(4-toluenesulfonyloxy)benzenesulfonic acid anions, pentafluorobenzenesulfonic acid anions, 2,2,2-trifluoroethanesulfonic acid anions, nonafluorobutanesulfonic acid anions, heptadecafluorooctanesulfonic acid anions, and camphorsulfonic acid anions.

In the chemically amplified positive resist composition, an appropriate amount of the photoacid generator (C) is 0.5 to 20 parts, more preferably 1 to 10 parts by weight per 100 parts by weight of the base resin in the composition. The photoacid generators may be used alone or in admixture of two or more. The transmittance of the resist film can be controlled by using a photoacid generator having a low transmittance at the exposure wavelength and adjusting the amount of the photoacid generator added.

Dissolution Inhibitor D

The dissolution inhibitor (D) is a compound having on the molecule at least two phenolic hydroxyl groups, in which an average of from 10 to 100 mol % of all the hydrogen atoms on the phenolic hydroxyl groups are replaced with acid labile groups. The compound has a weight average molecular weight within the range of 100 to 1,000, and preferably 150 to 800. The dissolution inhibitor may be formulated in an amount of 0 to 50 parts, preferably 5 to 50 parts, and more preferably 10 to 30 parts by weight, per 100 parts by weight of the base resin, and may be used singly or as a mixture of two or more thereof. Less amounts of the dissolution inhibitor may fail to provide an improved resolution, whereas too much amounts would lead to slimming of the patterned film, and thus a decline in resolution.

Illustrative, non-limiting, examples of the dissolution inhibitor (D) which are useful herein include bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)methane, 2,2-bis(4'-(2''-tetrahydropyranyloxy))propane, 2,2-bis(4'-(2''-tetrahydrofuranyloxy)phenyl)propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1''-ethoxyethoxy)phenyl)propane, 2,2-bis(4'-(1''-ethoxypropyloxy)phenyl)propane, tert-butyl 4,4-bis(4'-(2''-tetrahydropyranyloxy)phenyl)valerate, tert-butyl 4,4-bis(4'-(2''-tetrahydrofuranyloxy)phenyl)valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)-valerate, tert-butyl 4,4-bis(4'-(1''-ethoxyethoxy)phenyl)valerate, tert-butyl 4,4-bis(4'-(1''-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy)phenyl)methane, 1,1,2-tris(4'-(2''-tetrahydropyranyloxy)phenyl)ethane, 1,1,2-tris(4'-(2''-tetrahydrofuranyloxy)phenyl)ethane, 1,1,2-tris(4'-tert-butoxyphenyl)ethane, 1,1,2-tris(4'-tert-butoxycarbonyloxyphenyl)ethane, 1,1,2-tris(4'-tert-butoxycarbonylmethyloxyphenyl)ethane, 1,1,2-tris(4'-(1'-ethoxyethoxy)phenyl)ethane, and 1,1,2-tris(4'-(1'-ethoxypropyloxy)phenyl)ethane.

Basic Compound E

The basic compound (E) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure and reduces substrate and environment dependence, as well as improving the exposure latitude and the pattern profile.

Examples of basic compounds include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, and imide derivatives.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds with carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds with sulfonyl group include 3-pyridinesulfonic acid and pyridinium p-toluenesulfonate. Examples of suitable nitrogen-containing compounds with hydroxyl group, nitrogen-containing compounds with hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl) pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in admixture.

$$N(X)_n(Y)_{3-n} \quad (B)\text{-}1$$

In the formula, n is equal to 1, 2 or 3; side chain X, which may be the same or different, is independently selected from groups of the following general formulas (X)-1 to (X)-3, and two or three X's may bond together to form a ring; and side chain Y, which may be the same or different, is independently hydrogen or a straight, branched or cyclic alkyl group of 1 to 20 carbon atoms which may contain a hydroxyl group or ether.

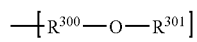

In the formulas, $R^{300}$, $R^{302}$ and $R^{305}$ are independently straight or branched alkylene groups of 1 to 4 carbon atoms; $R^{301}$ and $R^{304}$ are independently hydrogen, straight, branched or cyclic alkyl groups of 1 to 20 carbon atoms, which may contain at least one hydroxyl group, ether, ester or lactone ring; $R^{303}$ is a single bond or a straight or branched alkylene group of 1 to 4 carbon atoms; and $R^{306}$ is a straight, branched or cyclic alkyl group of 1 to 20 carbon atoms, which may contain at least one hydroxyl group, ether, ester or lactone ring.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8] hexacosane, 4,7,13,18-tetraoxa-1,10-diazabicyclo[8.5.5] eicosane, 1,4,10,13-tetraoxa-7,16-diazabicyclooctadecane, 1-aza-12-crown-4,1-aza-15-crown-5,1-aza-18-crown-6, tris (2-formyloxyethyl)amine, tris(2-acetoxyethyl)amine, tris(2-propionyloxyethyl)amine, tris(2-butyryloxyethyl)amine, tris (2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris [2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl) amine, N,N-bis(2-hydroxyethyl)-2-(methoxycarbonyl) ethylamine, N,N-bis(2-acetoxyethyl)-2-(methoxycarbonyl) ethylamine, N,N-bis(2-hydroxyethyl)-2-(ethoxycarbonyl) ethylamine, N,N-bis(2-acetoxyethyl)-2-(ethoxycarbonyl) ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl) ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl] ethylamine, N,N-bis(2-acetoxyethyl)-2-[(2-oxotetrahydrofuran-3-yl)oxy-carbonyl]ethylamine, N,N-bis (2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl] amine, N-(2-methoxyethyl)-bis[2-(methoxycarbonyl)ethyl] amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis (methoxycarbonylmethyl)amine, and β-(diethylamino)-δ-valerolactone.

The basic compounds may be used alone or in admixture of two or more. The basic compound is preferably formulated in an amount of 0 to 2 parts, and especially 0.01 to 1 part by weight, per 100 parts by weight of the base resin in the resist composition. The use of more than 2 parts of the basic compound may result in too low a sensitivity.

In the resist composition, a surfactant may be added for improving coating characteristics. Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (Dai-Nippon Ink & Chemicals, Inc.), Fluorad FC430 and FC431 (Sumitomo 3M Co., Ltd.), Asahiguard AG710, Surflon S-381, S-382, SC101, SC102, SC103, SC104, SC105, SC106, Surfynol E1004, KH-10, KH-20, KH-30 and KH-40 (Asahi Glass Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC430, Surflon S-381, Surfynol E1004, KH-20 and KH-30 are preferred. These surfactants may be used alone or in admixture.

In the resist composition, the surfactant is preferably formulated in an amount of up to 2 parts, and especially up to 1 part by weight, per 100 parts by weight of the base resin.

For the microfabrication of integrated circuits, any well-known lithography may be used to form a resist pattern from the chemically amplified positive resist composition of the invention.

The composition is applied onto a substrate (on which an integrated circuit is to be formed, e.g., Si, $SiO_2$, SiN, SiON, TiN, WSi, BPSG, SOG, organic anti-reflecting film, etc.) by a suitable coating technique such as spin coating, roll coating, flow coating, dip coating, spray coating or doctor coating. The coating is prebaked on a hot plate at a temperature of 60 to 150° C. for about 1 to 10 minutes, preferably 80 to 120° C. for 1 to 5 minutes. The resulting resist film is generally 0.1 to 2.0 µm thick. With a mask having a desired pattern placed above the resist film, the resist film is then exposed to actinic radiation, preferably having an exposure wavelength of up to 300 nm, such as UV, deep-UW, electron beams, x-rays, excimer laser light, γ-rays and synchrotron radiation in an exposure dose of about 1 to 200 $mJ/cm^2$, preferably about 10 to 100 $mJ/cm^2$. The film is further baked on a hot plate at 60 to 150° C. for 1 to 5 minutes, preferably 80 to 120° C. for 1 to 3 minutes (post-exposure baking=PEB).

Thereafter the resist film is developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dip, puddle or spray technique. In this way, a desired resist pattern is formed on the substrate. It is appreciated that the resist composition of the invention is best suited for micro-patterning using such high-energy radiation as deep UV with a wavelength of 254 to 193 nm, vacuum UV with a wavelength of 157 nm, electron beams, soft x-rays, x-rays, excimer laser light, γ-rays and synchrotron radiation. With any of the above-described parameters outside the above-described range, the process may sometimes fail to produce the desired pattern.

EXAMPLE

Examples of the invention are given below by way of illustration and not by way of limitation. The abbreviation Mw is a weight average molecular weight, Mn is a number average molecular weight, both as measured by gel permeation chromatography (GPC) versus polystyrene standards, Mw/Mn is a molecular weight dispersity, NMR is nuclear magnetic resonance, and AIBN is azobisisobutyronitrile.

Synthesis Example 1

In a 1-L flask were admitted 270.7 g of acetoxystyrene, 129.3 g of indene, and 200 g of toluene as a solvent. The reactor was cooled to −70° C. in a nitrogen atmosphere, whereupon vacuum deaeration and nitrogen flow were repeated three times. The reactor was warmed up to room temperature, 13.7 g of AIBN was added as a polymerization initiator, and the reactor was further heated to 55° C., at which reaction was effected for 40 hours. The reaction solution was concentrated to a ½ volume and poured into 5.0 L of methanol for precipitation. The resulting white solids were filtered and vacuum dried at 40° C., obtaining 260 g of a white polymer. The polymer was dissolved in a mixture of 0.4 L methanol and 0.5 L tetrahydrofuran again, to which 140 g of triethylamine and 30 g of water were added. The reactor was heated to 60° C., allowing deprotection reaction to occur. The reaction solution was neutralized with acetic acid, concentrated, dissolved in 0.5 L of acetone, and poured into 10 L of water for precipitation. Filtration and drying in the same way as above gave 198 g of a white polymer.

The polymer was analyzed by $^{13}$C-NMR, $^1$H-NMR and GPC, with the analytical results shown below.

Copolymer Compositional Ratio hydroxystyrene:indene=88.1:11.9

Mw=10,000

Mw/Mn=1.85

This polymer is designated Polymer 1.

Synthesis Example 2

In a 1-L flask were admitted 306.1 g of acetoxystyrene, 93.9 g of indene, and 200 g of toluene as a solvent. The reactor was cooled to −70° C. in a nitrogen atmosphere, whereupon vacuum deaeration and nitrogen flow were repeated three times. The reactor was warmed up to room temperature, 17.7 g of AIBN was added as a polymerization initiator, and the reactor was further heated to 55° C., at which reaction was effected for 40 hours. The reaction solution was concentrated to a ½ volume and poured into 5.0 L of methanol for precipitation. The resulting white solids were filtered and vacuum dried at 40° C., obtaining 282 g of a white polymer. The polymer was dissolved in a mixture of 0.4 L methanol and 0.5 L tetrahydrofuran again, to which 140 g of triethylamine and 30 g of water were added. The reactor was heated to 60° C., allowing deprotection reaction to occur. The reaction solution was neutralized with acetic acid, concentrated, dissolved in 0.5 L of acetone, and poured into 10 L of water for precipitation. Filtration and drying in the same way as above gave 187 g of a white polymer.

The polymer was analyzed by $^{13}$C-NMR, $^1$H-NMR and GPC, with the analytical results shown below.
Copolymer Compositional Ratio
hydroxystyrene:indene=91.4:8.6
Mw=13,200
Mw/Mn=1.88
This polymer is designated Polymer 2.

Synthesis Example 3

In a 1-L flask were admitted 50.0 g of the hydroxystyrene-indene copolymer (Polymer 1) and 300 g of tetrahydrofuran as a solvent. The reactor was cooled to 5° C. in a nitrogen atmosphere, whereupon 31.0 g of triethylamine was added, and 12.7 g of acetalizing agent A, identified later, was added dropwise over one hour. The reactor was warmed up to room temperature, at which reaction was allowed to occur for 4 hours. The reaction solution was concentrated, dissolved in 200 g of acetone, neutralized with acetic acid, and poured into 7.0 L of water for crystallization and precipitation. The resulting white solids were filtered and dried in vacuum at 40° C., obtaining 53.5 g of a white polymer.
The polymer was analyzed by $^{13}$C-NMR, $^1$H-NMR and GPC, with the analytical results shown below.
Copolymer Compositional Ratio
hydroxystyrene:indene:4-methoxyisobutoxystyrene=70.7:11.9:17.4
Mw=15,100
Mw/Mn=1.98
This polymer is designated Polymer A.

Synthesis Example 4

In a 1-L flask were admitted 50.0 g of the hydroxystyrene-indene copolymer (Polymer 2) and 300 g of tetrahydrofuran as a solvent. The reactor was cooled to 5° C. in a nitrogen atmosphere, whereupon 31.0 g of triethylamine was added, and 14.7 g of acetalizing agent A, identified later, was added dropwise over one hour. The reactor was warmed up to room temperature, at which reaction was allowed to occur for 4 hours. The reaction solution was concentrated, dissolved in 200 g of acetone, neutralized with acetic acid, and poured into 7.0 L of water for crystallization and precipitation. The resulting white solids were filtered and dried in vacuum at 40° C., obtaining 49.8 g of a white polymer.
The polymer was analyzed by $^{13}$C-NMR, $^1$H-NMR and GPC, with the analytical results shown below.
Copolymer Compositional Ratio
hydroxystyrene:indene:4-methoxyisobutoxystyrene=70.1:8.4:21.5
Mw=17,200
Mw/Mn=1.93
This polymer is designated Polymer B.

Synthesis Example 5

In a 1-L flask were admitted 70.0 g of the hydroxystyrene-indene copolymer (Polymer 1) and 400 g of. tetrahydrofuran as a solvent. The reactor was cooled to 5° C. in a nitrogen atmosphere, whereupon 31.4 g of triethylamine was added, and 20.1 g of an acetalizing agent B, identified later, was added dropwise over one hour. The reactor was warmed up to room temperature, at which reaction was allowed to occur for 4 hours. The reaction solution was concentrated, dissolved in 230 g of acetone, neutralized with acetic acid, and poured into 7.0 L of water for crystallization and precipitation. The resulting white solids were filtered and dried in a reduced pressure at 40° C., obtaining 73.7 g of a white polymer.
The polymer was analyzed by $^{13}$C-NMR, $^1$H-NMR and GPC, with the analytical results shown below.
Copolymer Compositional Ratio
hydroxystyrene:indene:4-cyclohexyloxyisobutoxystyrene=76.8:11.1:12.1
Mw=16,100
Mw/Mn=1.88
This polymer is designated Polymer C.

Synthesis Example 6

In a 1-L flask were admitted 70.0 g of the hydroxystyrene-indene copolymer (Polymer 2) and 400 g of tetrahydrofuran as a solvent. The reactor was cooled to 5° C. in a nitrogen atmosphere, whereupon 31.4 g of triethylamine was added, and 24.3 g of acetalizing agent B, identified later, was added dropwise over one hour. The reactor was warmed up to room temperature, at which reaction was allowed to occur for 4 hours. The reaction solution was concentrated, dissolved in 230 g of acetone, neutralized with acetic acid, and poured into 7.0 L of water for crystallization and precipitation. The resulting white solids were filtered and dried in vacuum at 40° C., obtaining 70.1 g of a white polymer.
The polymer was analyzed by $^{13}$C-NMR, $^1$H-NMR and GPC, with the analytical results shown below.
Copolymer Compositional Ratio
hydroxystyrene:indene:4-cyclohexyloxyisobutoxystyrene=76.4:8.2:15.4
Mw=17,900
Mw/Mn=1.89
This polymer is designated Polymer D.
As in the foregoing Synthesis Examples, Polymers E and F were synthesized using acetalizing agent C, identified later.
Polymer E
Ratio=80.5:11.5:8.0
Mw=16,300
Mw/Mn=1.92
Polymer F
Ratio=81.9:8.0:10.1
Mw=17,900
Mw/Mn=1.90

Comparative Synthesis Example 1

In a 1-L flask were admitted 50.0 g of polyhydroxystyrene (Mw=10,300, Mw/Mn=1.04) and 450 g of tetrahydrofuran as a solvent. The reactor was cooled to 5° C. in a nitrogen atmosphere, whereupon 43.4 g of triethylamine was added, and 20.4 g of acetalizing agent A, identified later, was added dropwise over one hour. The reactor was warmed up to room temperature, at which reaction was allowed to occur for 2 hours. The reaction solution was concentrated, dissolved in 300 g of acetone, neutralized with acetic acid, and poured into 7.0 L of water for crystallization and precipitation. The resulting white solids were filtered and dried in vacuum at 40° C., obtaining 52.0 g of a white polymer.

The polymer was analyzed by $^{13}$C-NMR, $^{1}$H-NMR and GPC, with the analytical results shown below.
Copolymer Compositional Ratio
hydroxystyrene:4-methoxyisobutoxystyrene=72.0:28.0
Mw=14,000
Mw/Mn=1.10
This polymer is designated Polymer G.

Comparative Synthesis Example 2

In a 1-L flask were admitted 50.0 g of polyhydroxystyrene (Mw=10,300, Mw/Mn=1.04) and 450 g of tetrahydrofuran as a solvent. The reactor was cooled to 5° C. in a nitrogen atmosphere, whereupon 43.4 g of triethylamine was added, and 15.9 g of acetalizing agent B, identified later, was added dropwise over one hour. The reactor was warmed up to room temperature, at which reaction was allowed to occur for 2 hours. The reaction solution was concentrated, dissolved in 300 g of acetone, neutralized with acetic acid, and poured into 7.0 L of water for crystallization and precipitation. The resulting white solids were filtered and dried in vacuum at 40° C., obtaining 52.0 g of a white polymer.

The polymer was analyzed by $^{13}$C-NMR, $^{1}$H-NMR and GPC, with the analytical results shown below.
Copolymer Compositional Ratio
hydroxystyrene:4-cyclohexyloxyisobutoxystyrene=77.7: 22.3
Mw=15,200
Mw/Mn=1.09
This polymer is designated Polymer H.

Comparative Synthesis Example 3

The hydroxystyrene-indene copolymer (Polymer 1) was modified with ethyl vinyl ether in the presence of an acid catalyst.
Copolymer Compositional Ratio
hydroxystyrene:indene:4-ethoxyethoxystyrene=64.4:8.5: 27.1
Mw=16,600
Mw/Mn=1.90
This polymer is designated Polymer I.

The acetalizing agents A, B and C have the following structural formulae.

Acetalizing agent A

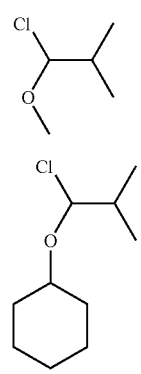

Acetalizing agent B

Acetalizing agent C

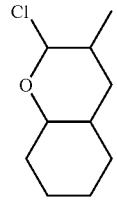

Polymers A to I have the following structural formulae.

Polymer A, B

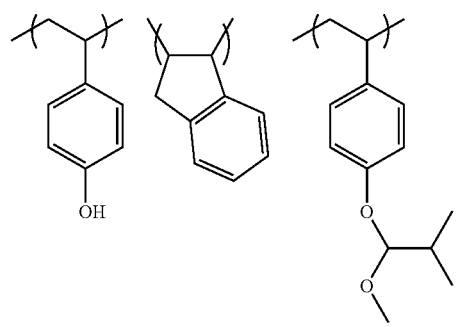

Polymer C, D

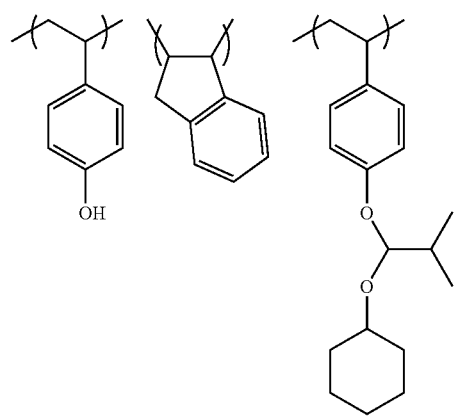

Polymer E, F

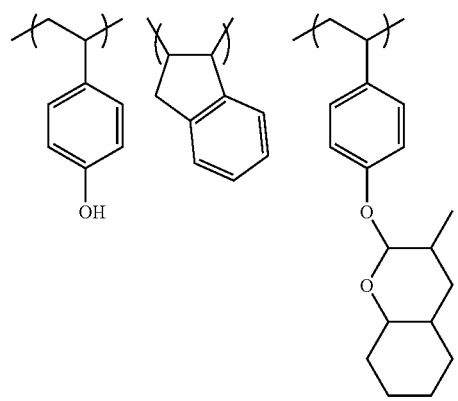

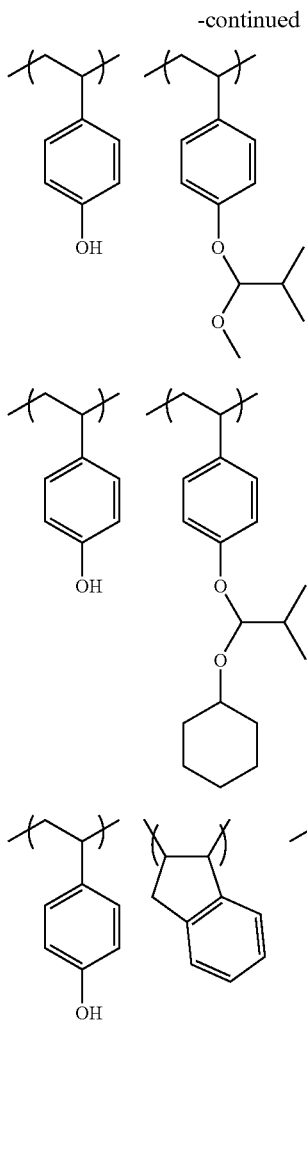

Polymer G

Polymer H

Polymer I

Examples 1-6 & Comparative Examples 1-3

Resist compositions were prepared according to the formulation shown in Tables 1 and 2. The polymers are Polymers A to I obtained in the above Synthesis Examples and Comparative Synthesis Examples. The remaining components listed in Tables 1 and 2 have the following meaning.

| | |
|---|---|
| PAG1: | (4-butoxyphenyl)diphenylsulfonium 10-camphorsulfonate |
| PAG2: | bis(cyclohexylsulfonyl)diazomethane |
| Dissolution inhibitor A: | bis(4-(2'-tetrahydropyranyloxy)phenyl)-methane |
| Basic compound A: | tris(2-methoxyethyl)amine |
| Surfactant A: | FC-430 (Sumitomo 3M Co., Ltd.) |
| Surfactant B: | Surflon S-381 (Asahi Glass Co., Ltd.) |
| Solvent A: | propylene glycol methyl ether acetate |
| Solvent B: | ethyl lactate |

TABLE 1

| | Example | | | |
|---|---|---|---|---|
| Component (pbw) | 1 | 2 | 3 | 4 |
| Polymer A | 80 | — | — | — |
| Polymer B | — | 80 | — | — |
| Polymer C | — | — | 80 | — |
| Polymer D | — | — | — | 80 |
| PAG1 | 1 | 1 | 1 | 1 |
| PAG2 | 2 | 2 | 2 | 2 |
| Dissolution inhibitor A | — | — | — | — |
| Basic compound A | 0.2 | 0.2 | 0.2 | 0.2 |
| Surfactant A | 0.07 | 0.07 | 0.07 | 0.07 |
| Surfactant B | 0.07 | 0.07 | 0.07 | 0.07 |
| Solvent A | 300 | 300 | 300 | 300 |
| Solvent B | 130 | 130 | 130 | 130 |

TABLE 2

| | Example | | Comparative Example | | |
|---|---|---|---|---|---|
| Component (pbw) | 5 | 6 | 1 | 2 | 3 |
| Polymer E | 80 | — | — | — | — |
| Polymer F | — | 80 | — | — | — |
| Polymer G | — | — | 80 | — | — |
| Polymer H | — | — | — | 80 | — |
| Polymer I | — | — | — | — | 80 |
| PAG1 | 1 | 1 | 1 | 1 | 1 |
| PAG2 | 2 | 2 | 2 | 2 | 2 |
| Dissolution inhibitor A | — | — | — | — | — |
| Basic compound A | 0.2 | 0.2 | 0.2 | 0.2 | 0.2 |
| Surfactant A | 0.07 | 0.07 | 0.07 | 0.07 | 0.07 |
| Surfactant B | 0.07 | 0.07 | 0.07 | 0.07 | 0.07 |
| Solvent A | 300 | 300 | 300 | 300 | 300 |
| Solvent B | 130 | 130 | 130 | 130 | 130 |

The resist solutions thus obtained were each filtered through a 0.1-μm Teflon® filter. These resist solutions were spin-coated onto silicon wafers, then baked on a hot plate at 100° C. for 90 seconds to give resist films having a thickness of 0.25 μm. The resist films were exposed using an excimer laser stepper NSR2005EX (Nikon Corp., NA 0.6), then baked at 110° C. for 90 seconds (post-exposure baking: PEB), and developed with a solution of 2.38 wt % tetramethylammonium hydroxide in water, thereby giving positive patterns (Examples 1-6 and Comparative Examples 1-3).

The resulting resist patterns were evaluated as described below.

Resist Pattern Evaluation

The exposure dose which provided a 1:1 resolution at the top and bottom of a 0.13-μm line-and-space pattern was the optimum exposure dose (sensitivity Eop). The minimum line width of a line-and-space pattern which was ascertained separate at this dose was the resolution of a test resist. The shape in cross section of the resolved resist pattern was examined under a scanning electron microscope (SEM).

Other Evaluation

The resist films as developed were examined for dry etching resistance using an instrument TE8500S (Tokyo Electron Co., Ltd.) where the films were actually etched. The pattern profile as etched was examined by observing a cross section of the resist film under SEM. Provided that a reduction in thickness after etching of the resist film of Comparative Example 1 is 1.0, thickness reductions of the other resist films are expressed in relative values. Smaller values indicate better etching resistance. The etching conditions are shown below.

| | Prees: | | 250 mJ |
|---|---|---|---|
| | RF Power: | | 800 W |
| | Gas: | 1) CHF$_3$ | 20 sccm |
| | | 2) CF$_4$ | 20 sccm |
| | | 3) Ar | 400 sccm |
| | Etching time: | | 150 sec |

The results are shown in Table 3.

TABLE 3

| | Sensitivity (mJ/cm$^2$) | Resolution (μm) | Pattern profile | Etching resistance (relative thickness reduction) |
|---|---|---|---|---|
| Comparative Example 1 | 25 | 0.13 | pattern collapse | 1 |
| Comparative Example 2 | 26 | 0.12 | pattern collapse | 0.98 |
| Comparative Example 3 | 24 | 0.11 | pattern collapse | 0.91 |
| Example 1 | 28 | 0.10 | slightly rounded | 0.83 |
| Example 2 | 26 | 0.09 | slightly rounded | 0.86 |
| Example 3 | 25 | 0.09 | rectangular | 0.79 |
| Example 4 | 26 | 0.09 | rectangular | 0.82 |
| Example 5 | 27 | 0.11 | rectangular | 0.75 |
| Example 6 | 27 | 0.10 | rectangular | 0.78 |

Japanese Patent Application No. 2005-323523 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a polymer comprising recurring units of the following general formula (5) and having a weight average molecular weight of 1,000 to 500,000,

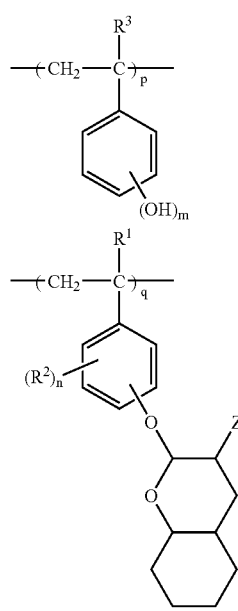

(5)

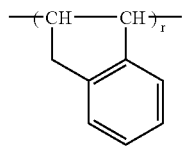

wherein $R^1$ and $R^3$ are each independently a hydrogen atom, hydroxy group, straight or branched alkyl group, halogen atom or trifluoromethyl group, $R^2$ is a hydrogen atom, hydroxy group, halogen atom or trifluoromethyl group, Z is a hydrogen atom or straight, branched or cyclic alkyl group of 1 to 10 carbon atoms, n is 0 or a positive integer of 1 to 4, m is 0 or a positive integer of 1 to 5, and p, q and r are positive numbers.

2. A chemically amplified positive resist composition comprising (A) an organic solvent, (B) a polymer as a base resin, and (C) a photoacid generator, the polymer consisting of recurring units of the following general formula (5) and having a weight average molecular weight of 1,000 to 500,000,

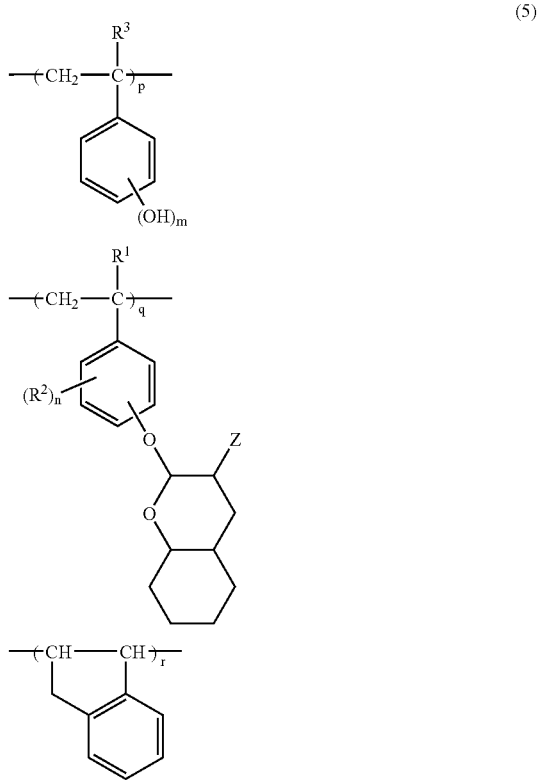

wherein $R^1$ and $R^3$ are each independently a hydrogen atom, hydroxy group, straight or branched alkyl group, halogen atom or trifluoromethyl group, $R^2$ is a hydrogen atom, hydroxy group, halogen atom or trifluoromethyl group, Z is a hydrogen atom or straight, branched or cyclic alkyl group of 1 to 10 carbon atoms, n is 0 or a positive integer of 1 to 4, m is 0 or a positive integer of 1 to 5, and p, q and r are positive numbers.

3. A process for forming a resist pattern comprising the steps of:

applying the resist composition of claim 2 onto a substrate to form a coating, heat treating the coating and then exposing it to high-energy radiation, EUV or electron beam through a photomask, and optionally heat treating the exposed coating and developing it with a liquid developer.

* * * * *